(12) United States Patent
Hung et al.

(10) Patent No.: US 6,828,664 B2
(45) Date of Patent: Dec. 7, 2004

(54) PACKAGING SUBSTRATE WITH ELECTROSTATIC DISCHARGE PROTECTION

(75) Inventors: Chih-Pin Hung, Kaoshiung (TW); Yung-Chi Lee, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 241 days.

(21) Appl. No.: 10/282,422

(22) Filed: Oct. 29, 2002

(65) Prior Publication Data

US 2003/0091673 A1 May 15, 2003

(30) Foreign Application Priority Data

Nov. 14, 2001 (TW) .......................... 90128192 A

(51) Int. Cl.[7] .............................................. H01L 23/02
(52) U.S. Cl. ...................... 257/678; 257/698; 257/725; 438/107; 438/110
(58) Field of Search .............................. 257/678, 698, 257/725; 438/107, 110

(56) References Cited

U.S. PATENT DOCUMENTS 5,185,654 A * 2/1993 Mosher et al. .............. 257/659
6,613,979 B1 * 9/2003 Miller et al. ................ 174/52.2
6,700,077 B2 * 3/2004 Chiang ........................ 174/262
2003/0102016 A1 * 6/2003 Bouchard ..................... 134/32
2004/0048009 A1 * 3/2004 Extrand et al. ............. 428/34.1

FOREIGN PATENT DOCUMENTS

JP       59225550 A   * 12/1984    ........... H01L/23/48

* cited by examiner

Primary Examiner—Tom Thomas
Assistant Examiner—Matthew E. Warren
(74) Attorney, Agent, or Firm—Seyfarth Shaw LLP

(57) ABSTRACT

The present invention relates to a packaging substrate with electrostatic discharge protection. The packaging substrate is disposed in a recess of a mold and comprises an outer wall electrically connecting an inner wall of the recess. A first copper-mesh layer and a second copper-mesh layer extend to the outer wall to electrically connect the inner wall of the recess. Static electric charges generated during the molding process are conducted via the first copper-mesh layer or the second copper-mesh layer to the inner wall of the recess and then conducted away. Therefore, the static electric charges generated during the molding process can be safely conducted away from the packaging substrate, preventing the dies to be packaged from damage due to electrostatic discharge so as to raise the yield rate of semiconductor package products.

7 Claims, 3 Drawing Sheets

PACKAGING SUBSTRATE WITH ELECTROSTATIC DISCHARGE PROTECTION

BACKGROUND OF THE INVENTION

1. Field of the Invention

The present invention relates to a packaging substrate, more particularly, to a packaging substrate with electrostatic discharge protection.

2. Description of the Related Art

The working voltage of an integrated circuit is typically of 5; volts or less. When the integrated circuit is applied with relatively higher voltage, the integrated circuit will usually be damaged. Static electric charges are generated from friction, induction and contact; but the popularly used chips are rarely designed with a circuit for electrostatic discharge protection to safeguard against damage to chips from static electricity. Most chips are not equipped with such an electrostatic protective circuit.

In addition, during the process for packaging or molding the dies, when the mould compound is injected to package the die, static electric charges will be generated from friction, induction and contact between the mould compound and the packaging substrate or other medium. The electrostatic discharge will damage the die and fail the semiconductor package products.

Therefore, it is necessary to provide an innovative and advanced packaging substrate so as to solve the above problem.

SUMMARY OF THE INVENTION

One objective of the present invention is to provide a packaging substrate with electrostatic discharge protection. The packaging substrate is disposed in a mold. The mold comprises a recess having a shape corresponding to that of the packaging substrate, and the recess comprises an inner wall which is electrically connected to an outer wall of the packaging substrate. The packaging substrate comprises a first copper-mesh layer and a second copper-mesh layer extending to the outer wall to electrically connect the inner wall of the recess. Therefore, static electric charges generated during the molding process are conducted via the first copper-mesh layer or the second copper-mesh layer to the inner wall of the recess and then conducted away, preventing the dice to be packaged from damage due to electrostatic discharge, so as to raise the yield rate of semiconductor package products.

One objective of the present invention is to provide a packaging substrate with electrostatic discharge protection. The packaging substrate comprises a plurality of position holes used for receiving and electrically connecting position pins of the recess to position the packaging substrate in the recess. Because the first copper-mesh layer and the second copper-mesh layer are electrically connected to the position holes, static electric charges generated during the molding process are conducted via the first copper-mesh layer or the second copper-mesh layer to the position holes and then conducted away via the position pins. For this reason, the packaging substrate according to the invention can conduct the static electric charges away from the packaging substrate, preventing the dice to be packaged from damage due to electrostatic discharge.

DETAILED DESCRIPTION OF THE INVENTION

Figure 1:
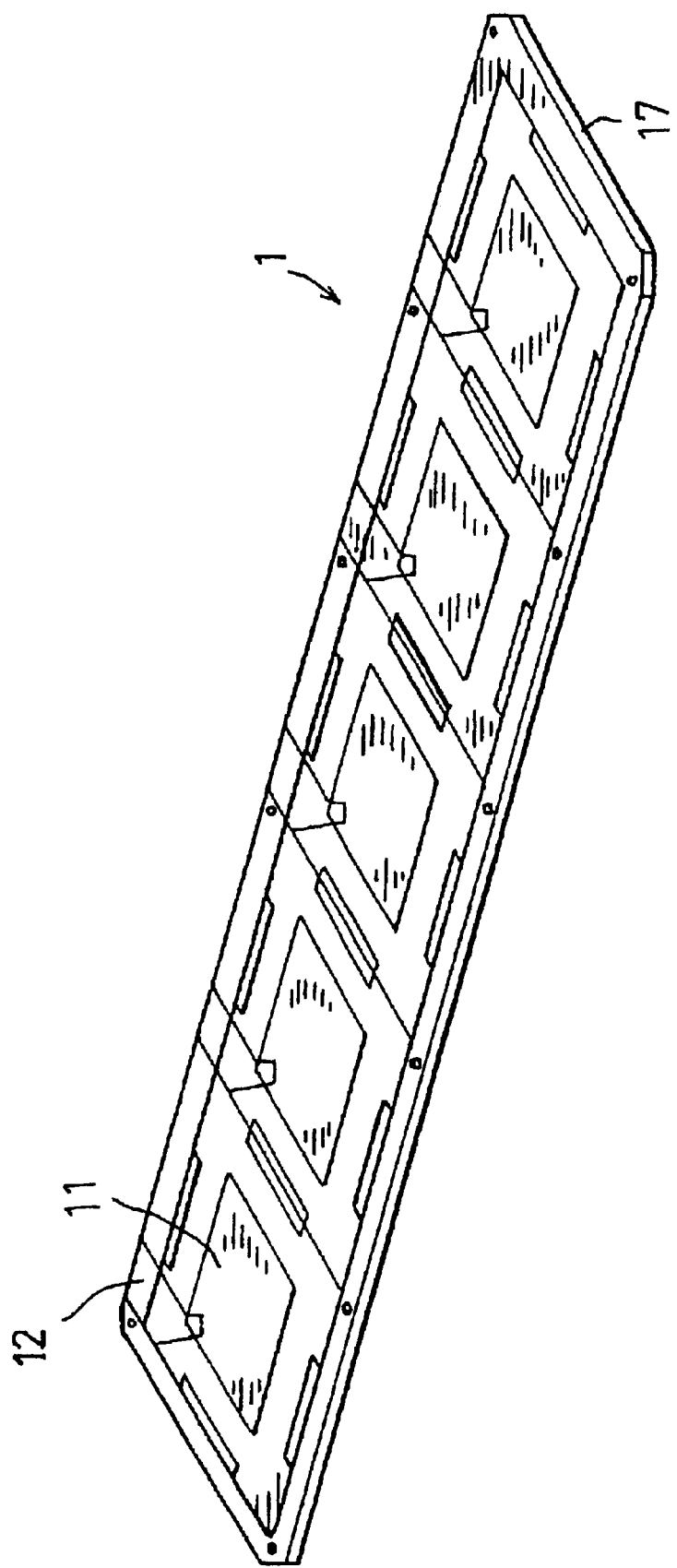
FIG. 1 shows the packaging substrate according to the invention.
Figure 2:
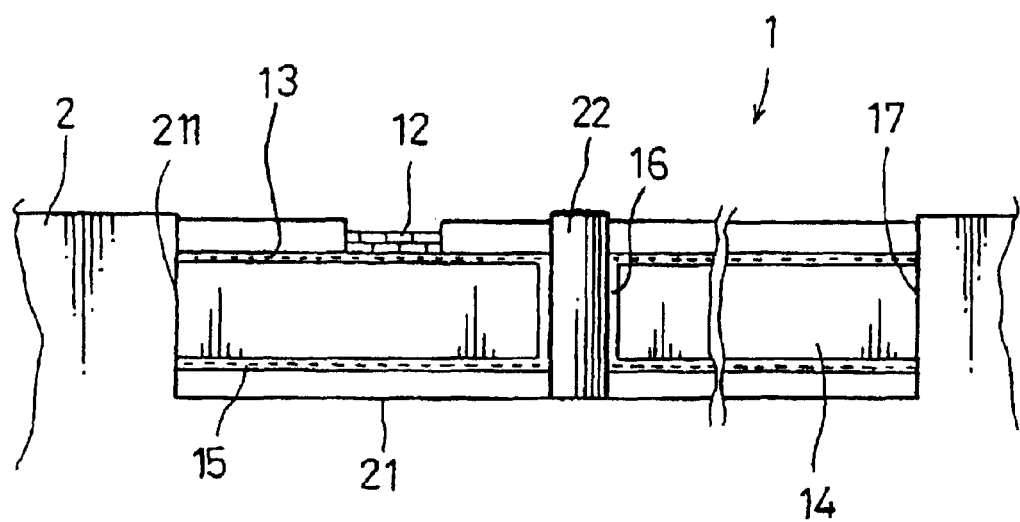
FIG. 2 shows a cross-sectional view of the packaging substrate and mold according to the invention.
Figure 3:
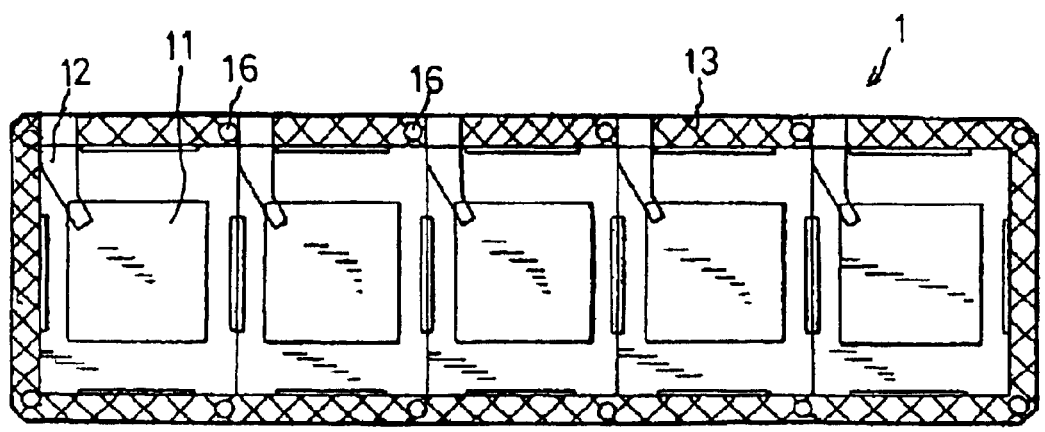
FIG. 3 shows a cross-sectional view of the packaging substrate according to the invention.
Figure 4:
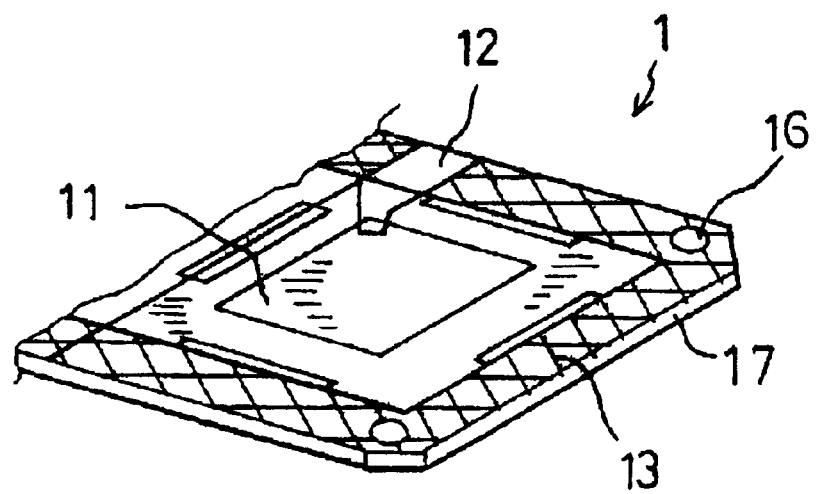
FIG. 4 shows a partial cross-sectional view of the packaging substrate according to the invention.

Referring to FIGS. 1 to 4, a packaging substrate 1 with electrostatic discharge protection according to the first embodiment of the invention is disposed in a mold 2, the mold 2 comprising a recess 21 having a corresponding shape with that of the packaging substrate 1 and a plurality of position pins 212. The recess 21 is used to receive the packaging substrate 1 and comprises an inner wall 211.

The packaging substrate 1 comprises: five die pads 11, five mold gates 12, a first copper-mesh layer 13, a dielectric layer 14, a second copper-mesh layer 15, a plurality of position holes 16, and an outer wall 17. The die pad 11 supports the die. Each mold gate 12 is connected to each die pad 11 on the periphery of the packaging substrate 1 and through which the molding compound is injected into the die pads 11. The mold gates 12 are at a top side of the packaging substrate 1. The outer wall 17 of the packaging substrate 1 is contacted with the inner wall 211 of the recess 21.

The first copper-mesh layer 13 is formed on the periphery of the packaging substrate 1 and is electrically connected to the mold gates 12. Along the periphery of the packaging substrate 1, the first copper-mesh layer 13 is formed below the mold gate 12 and is electrically connected to the mold gate 12. The first copper-mesh layer 13 extends to the outer wall 17 to electrically connect the inner wall 211 of the recess 21.

The second copper-mesh layer 15 is formed on the periphery of a bottom side of the packaging substrate 1 and extends to the outer wall 17 to electrically connect the inner wall 211 of the recess 21. The dielectric layer 14 is formed between the first copper-mesh layer 13 and the second copper-mesh layer 15.

A plurality of position holes 16 are formed on the periphery of the packaging substrate 1 and penetrate through the top side and the bottom side. The position holes 16 are used for receiving the position pins 212 to position the packaging substrate 1 in the recess 21 of the mold 2. An inner side of the position holes 16 is coated with a conducting layer or conducting materials to electrically connect the position pins 212. Besides, the first copper-mesh layer 13 and the second copper-mesh layer 15 are electrically connected to the position holes 16 and then electrically connected to the position pins 212.

During the process for packaging or molding the dice, static electric charges are generated when molding compound is rubbed, inducted, and contacted with the packaging substrate 1 or other medium. There are two releasing paths for the static electric charges; one is via the mold gate 12 to the first copper-mesh layer 13 and to the inner wall 211 of the recess 21, and then away via the mold 2; and the other is via the first copper-mesh layer 13 and the second copper-mesh layer 15 to the position holes 16 and to the position pins 212, and then away via the packaging mold 2.

Therefore, the packaging substrate 1 according to the invention can conduct the static electric charges away from the packaging substrate, preventing the dice to be packaged from damage due to electrostatic discharge.

While an embodiment of the present invention has been illustrated and described, various modifications and improvements can be made by those skilled in the art. The embodiment of the present invention is therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A packaging substrate with electrostatic discharge protection disposed in a mold, the mold comprising a recess having a corresponding shape with that of the packaging substrate, the recess comprising an inner wall, the packaging substrate comprising:

an outer wall contacting with the inner wall of the recess;

a top side and a bottom side;

at least one die pad for supporting a die;

at least one mold gate formed at the top side of the packaging substrate, each mold gate extending from an edge of the packaging substrate to the die pad to inject molding compound into the die pad;

a first copper-mesh layer formed on the periphery of the top side of the packaging substrate and extending to the outer wall to electrically connect the mold gate;

a second copper-mesh layer formed on the periphery of the bottom side of the packaging substrate; and a dielectric layer formed between the first copper-mesh layer and the second copper-mesh layer;

whereby, static electric charges generated during the molding process are conducted via the first copper-mesh layer to the inner wall of the recess and then conducted away.

2. The packaging substrate according to claim 1, wherein the first copper-mesh is electrically connected to the mold gates.

3. The packaging substrate according to claim 1, wherein the second copper-mesh extends to the outer wall to electrically connect the inner wall of the recess.

4. The packaging substrate according to claim 1, the mold further comprising a plurality of position pins, the packaging substrate further comprising a plurality of position holes formed on the periphery of the packaging substrate that penetrates through the top side and the bottom side for receiving and electrically connecting the position pins, wherein the first copper-mesh layer and the second copper-mesh layer are electrically connected to the position pins.

5. A packaging substrate with electrostatic discharge protection disposed in a mold, the mold comprising a recess having a corresponding shape with that of the packaging substrate and a plurality of position pins, the recess comprising an inner wall, the packaging substrate comprising:

an outer wall contacting with the inner wall of the recess;

a top side and a bottom side;

at least one die pad for supporting a die;

at least one mold gate formed at the top side of the packaging substrate, each mold gate extending from an edge of the packaging substrate to the die pad to inject molding compound into the die pad;

a plurality of position holes formed on the periphery of the packaging substrate that penetrates through the top side and the bottom side for receiving and electrically connecting the position pins;

a first copper-mesh layer formed on the periphery of the top side of the packaging substrate and electrically connecting the position holes;

a second copper-mesh layer formed on the periphery of the bottom side of the packaging substrate and electrically connecting the position holes; and a dielectric layer formed between the first copper-mesh layer and the second copper-mesh layer;

whereby, static electric charges generated during the molding process are conducted via the first copper-mesh layer or the second copper-mesh layer to the position holes and then conducted away via the position pins.

6. The packaging substrate according to claim 5, wherein the first copper-mesh is electrically connected to the mold gates.

7. The packaging substrate according to claim 1, wherein the second copper-mesh extends to the outer wall to electrically connect the inner wall of the recess.

* * * * *